United States Patent
Chu et al.

(10) Patent No.: US 11,901,323 B2
(45) Date of Patent: Feb. 13, 2024

(54) SEMICONDUCTOR PACKAGES HAVING CONDUCTIVE PILLARS WITH INCLINED SURFACES

(71) Applicant: Taiwan Semiconductor Manufacturing Company, Ltd., Hsinchu (TW)

(72) Inventors: Chiang-Jui Chu, Yilan County (TW); Ching-Wen Hsiao, Hsinchu (TW); Hao-Chun Liu, Hsinchu (TW); Ming-Da Cheng, Taoyuan (TW); Young-Hwa Wu, Tainan (TW); Tao-Sheng Chang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/841,683

(22) Filed: Jun. 16, 2022

(65) Prior Publication Data

US 2022/0310543 A1 Sep. 29, 2022

Related U.S. Application Data

(63) Continuation of application No. 16/866,562, filed on May 5, 2020, now Pat. No. 11,398,444.

(60) Provisional application No. 62/893,778, filed on Aug. 29, 2019.

(51) Int. Cl.
*H01L 23/00* (2006.01)
*H01L 25/065* (2023.01)
*H01L 25/00* (2006.01)

(52) U.S. Cl.
CPC .............. *H01L 24/13* (2013.01); *H01L 24/05* (2013.01); *H01L 24/16* (2013.01); *H01L 24/81* (2013.01); *H01L 25/0657* (2013.01); *H01L 25/50* (2013.01); *H01L 2224/13017* (2013.01); *H01L 2224/1355* (2013.01); *H01L 2224/16059* (2013.01); *H01L 2924/37001* (2013.01)

(58) Field of Classification Search
None
See application file for complete search history.

(56) References Cited

U.S. PATENT DOCUMENTS

2013/0134594 A1* 5/2013 Machida ............... H01L 21/768
257/772

* cited by examiner

*Primary Examiner* — Hung K Vu
(74) *Attorney, Agent, or Firm* — JCIPRNET

(57) ABSTRACT

A semiconductor package includes a first device, a second device and a solder region. The first device includes a first conductive pillar, wherein the first conductive pillar has a first sidewall, a second sidewall opposite to the first sidewall, a first surface and a second surface physically connected to the first surface, the first surface and the second surface are disposed between the first sidewall and the second sidewall, and an included angle is formed between the first surface and the second surface. The solder region is disposed between the first conductive pillar and the second device to bond the first device and the second device.

20 Claims, 6 Drawing Sheets

SEMICONDUCTOR PACKAGES HAVING CONDUCTIVE PILLARS WITH INCLINED SURFACES

CROSS-REFERENCE TO RELATED APPLICATION

This application is a continuation application of and claims the priority benefit of a prior application Ser. No. 16/866,562, filed on May 5, 2020 and now allowed, which claims the priority benefit of U.S. provisional application Ser. No. 62/893,778, filed on Aug. 29, 2019. The entirety of the above-mentioned patent applications is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
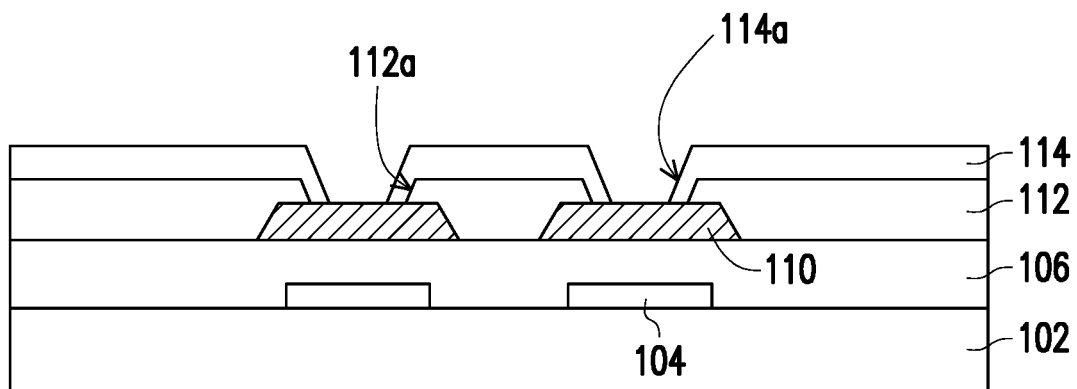
FIGS. 1A to 1E illustrate cross-sectional views of a method of forming an electrical device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A to 1E illustrate cross-sectional views of a method of forming an electrical device in accordance with some embodiments.

Referring to FIG. 1A, a substrate 102 with a plurality of conductive pads 110 is provided. In some embodiments, the substrate 102 may be a semiconductor substrate. The semiconductor substrate includes an elementary semiconductor such as silicon or germanium and/or a compound semiconductor such as silicon germanium, silicon carbide, gallium arsenic, indium arsenide, gallium nitride, or indium phosphide. In some embodiments, the substrate 102 includes a silicon-containing material. For example, the substrate 102 is a silicon-on-insulator (SOI) substrate or a silicon substrate. In various embodiments, the substrate 102 may take the form of a planar substrate, a substrate with multiple fins, nanowires, or other forms known to people having ordinary skill in the art. Depending on the requirements of design, the substrate 102 may be a P-type substrate or an N-type substrate and may have doped regions therein. The doped regions may be configured for an N-type device or a P-type device. In some embodiments, the substrate 102 may have through substrate vias therein upon the process requirements.

The substrate 102 includes isolation structures defining at least one active area, and at least one device 104 is disposed on/in the active area. The device 104 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the device 104 includes a gate dielectric layer, a gate electrode, source/drain regions, spacers, and the like.

In some embodiments, an interconnect structure 106 is disposed over a side (e.g., front side) of the substrate 102. Specifically, the interconnect structure 106 is disposed over and electrically connected to the device 104. In some embodiments, the interconnect structure 106 includes at least one insulating layer and a plurality of metal features. The metal features are disposed in the insulating layer and electrically connected with each other. In some embodiments, the insulating layer includes an inter-layer dielectric (ILD) layer on the substrate 102, and at least one inter-metal dielectric (IMD) layer over the inter-layer dielectric layer. In some embodiments, the insulating layer includes silicon oxide, silicon oxynitride, silicon nitride, benzocyclobutene (BCB) polymer, polyimide (PI), polybenzoxazole (PBO), or a combination thereof, and is formed by a suitable process such as spin coating, CVD, or the like. The insulating layer may be a single layer or a multiple-layer structure. In some embodiments, the metal features include metal vias and metal lines. The metal vias are formed between and in contact with two metal lines. The metal features may include tungsten (W), copper (Cu), a copper alloy, aluminum (Al), an aluminum alloy, or a combination thereof. In some embodiments, a barrier layer may be disposed between each metal feature and the insulating layer to prevent the material of the metal feature from migrating to the underlying device 104. The barrier layer may include tantalum (Ta), tantalum nitride (TaN), titanium (Ti), titanium nitride (TiN), cobalt tungsten (CoW), or a combination thereof. In some embodiments, the interconnect structure 106 is formed by a dual damascene process. In alternative embodiments, the interconnect structure 106 is formed by multiple single damascene processes. In yet alternative embodiments, the interconnect structure 106 is formed by an electroplating process.

In some embodiments, the conductive pads 110 are formed over the substrate 102. In some embodiments, the conductive pads 110 are formed over the insulating layer of the interconnect structure 106. Further, the conductive pads 110 may be electrically connected to top metal features exposed by the insulating layer of the interconnect structure 106. The conductive pads 110 may include tungsten (W), copper (Cu), a copper alloy, aluminum (Al), an aluminum alloy, titanium (Ti), a titanium alloy, tantalum (Ta), a tantalum alloy, or a combination thereof. For example, the conductive pads 110 are aluminum pads. In some embodiments, the conductive pads 110 may be formed by an electroplating process, CVD process, atomic layer deposition (ALD) process, PVD process, or other suitable process.

In some embodiments, a first passivation layer 112 is formed over the substrate 102. The first passivation layer 112 partially covers and partially exposes the conductive pads 110. For example, a material of the first passivation layer 112 is formed over the conductive pads 110, and then is patterned to form a plurality of first openings 112a to expose top surfaces of the conductive pads 110 respectively. In some embodiments, the first passivation layer 112 includes silicon oxide, silicon oxynitride, silicon nitride, a combination thereof, or the like. In some alternative embodiments, the first passivation layer 112 includes a polymer material such as polybenzoxazole (PBO), polyimide, benzocyclobutene (BCB), a combination thereof, or the like.

In some embodiments, a second passivation layer 114 is formed over the first passivation layer 112. The second passivation layer 114 covers a top surface of the first passivation layer 112, sidewalls of the first opening 112a and the top surfaces of the conductive pads 110. Further, the second passivation layer 114 partially exposes the top surfaces of the conductive pads 110 respectively. For example, a material of the second passivation layer 114 is formed over the first passivation layer 112 and the conductive pads 110, and then is patterned to form the second openings 114a to expose the top surfaces of the conductive pads 110 respectively. A diameter of the second opening 114a is smaller than a diameter of the first opening 112a, and the second opening 114a is disposed in the first opening 112a. A material of the second passivation layer 114 may be different from a material of the first passivation layer 112. In some embodiments, the second passivation layer 114 includes a polymer material such as polybenzoxazole (PBO), polyimide, benzocyclobutene (BCB), a combination thereof, or the like.

Figure 1B:
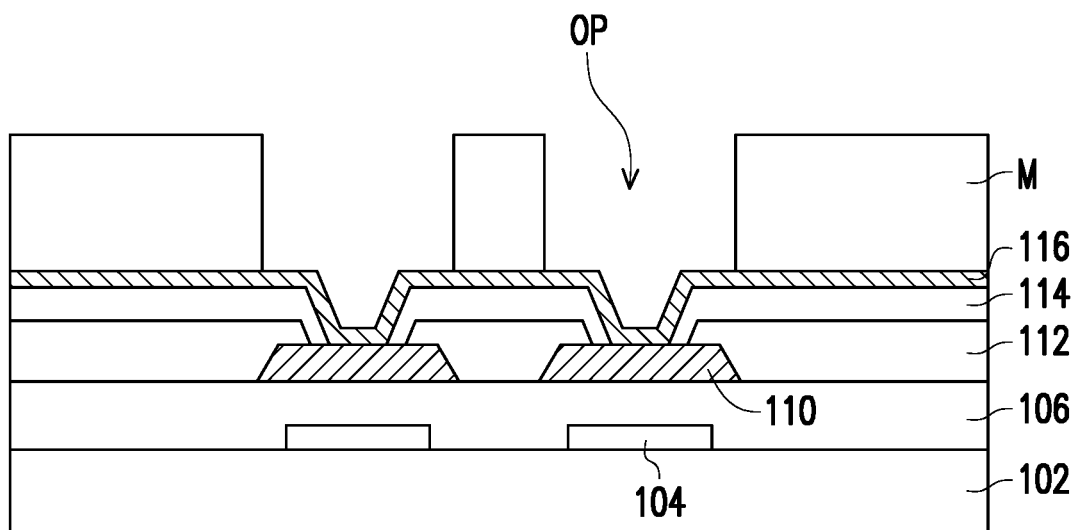

Referring to FIG. 1B, an under bump metallurgy (UBM) layer 116 is formed over the conductive pads 110 and the passivation layer 112. In some embodiments, the UBM layer 116 is blanket and conformally formed over the passivation layer 114 and the conductive pads 110. For example, the UBM layer 116 is formed on a top surface of the passivation layer 114, sidewalls of the opening 114a and exposed top surfaces of the conductive pads 110. The UBM layer 116 may include a diffusion barrier layer and a seed layer. The diffusion barrier layer may be formed of tantalum nitride, titanium nitride, tantalum, titanium, or the like. In some embodiments, the diffusion barrier layer may be formed by a physical vapor deposition (PVD) process, a sputtering process, or the like. The seed layer may include copper (Cu) or a copper alloy that includes silver, chromium, nickel, tin, gold, and a combination thereof. For example, the UBM layer 116 includes a diffusion barrier layer formed of Ti and a seed layer formed of Cu. However, the disclosure is not limited thereto.

Then, a patterned mask M is formed over the UBM layer 116 and is patterned to form a plurality of openings OP. In some embodiments, the opening OP is correspondingly disposed over the opening 114a. In some embodiments, a diameter of the opening OP is greater or equal to the diameter of the opening 114a. In some embodiments, the size of the opening OP is between about 5 μm to about 100 μm. In some embodiments, the patterned mask M may be a patterned photoresist mask, a patterned hard mask, or the like.

Figure 1C:
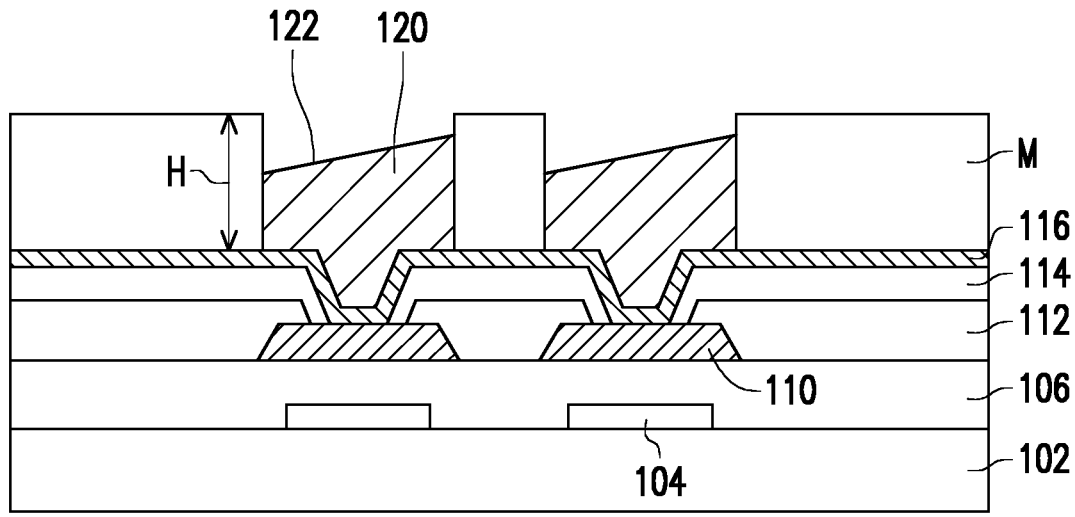
Figure 1D:
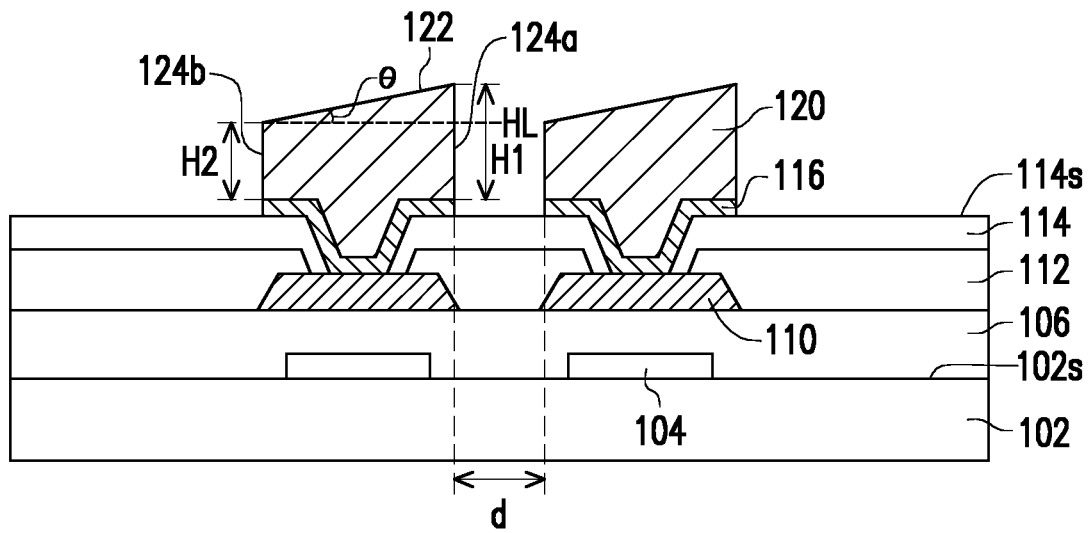

Referring to FIG. 1C, a plurality of conductive pillars (or posts) 120 are formed in the openings OP of the patterned mask M. In some embodiments, the conductive pillars 120 partially fill the openings OP of the patterned mask M to contact the UBM layer 116. For example, a largest height H1 (as shown in FIG. 1D) of the conductive pillars 120 is smaller than a depth of the openings OP (e.g., a high H of the patterned mask M). In some embodiments, the conductive pillar 120 is formed with an inclined top surface 122. The conductive pillars 120 may be formed by electroplating process, electroless plating process, or the like. The conductive pillars 120 may include tungsten (W), copper (Cu), a copper alloy, aluminum (Al), an aluminum alloy, titanium (Ti), a titanium alloy, tantalum (Ta), a tantalum alloy, the like, or a combination thereof.

In an embodiment, the conductive pillar 120 is formed by the electroplating process, and the inclined top surface 122 is generated by controlling at least one of process parameters such as a composition of a plating solution, a concentration of the plating solution, and a plating rate. In some embodiments, the plating solution is formed by $CuSO_4$, $H_2SO_4$ and HCl. In some embodiments, a concentration of $CuSO_4$ is 185~215 g/L, a concentration of $H_2SO_4$ is 85~115 g/L and a concentration of HCl is 41~69 ppm. In some embodiments, the plating solution is also referred to as a virgin make-up solution (VMS). In some embodiments, the plating solution further includes an additive for protocol control. The additive may be sulfuric acid, copper sulfate pentahydrate, methanesulfonic acid or a combination thereof, and a concentration thereof may be in a range from 0.1% to 0.6%. For example, a concentration of sulfuric acid is 0.4% to 0.6%, and a concentration of methanesulfonic acid is 0.1% to 0.3%. In some embodiments, the plating rate is between about 0.5 μm/min to about 4 μm/min. However, the disclosure is not limited thereto.

Referring to FIG. 1D, the patterned mask M is removed to expose a portion of the UBM layer 116. In some embodiments, the patterned mask M is removed by a stripping process. The stripping process may include an $O_2$ plasma ashing process, a wet etching process or a wet dip in a chemical solution such as sulfuric acid ($H_2SO_4$) solution. After removing the patterned mask M, portions of the UBM layer 116 are covered by the conductive pillars 120 while other portions of the UBM layer 116 are exposed. Then, the exposed portions of the UBM layer 116 are removed. In some embodiments, the exposed UBM layer 116 may be removed by a wet etching process such as a wet dip in a chemical solution of phosphoric acid ($H_3PO_4$) and hydrogen peroxide ($H_2O_2$), referred to as DPP, with 2% hydrofluoric (HF) acid.

As shown in FIG. 1D, a portion of the conductive pillar 120 is disposed in the second passivation layer 114, and a portion of the conductive pillar 120 is protruded from the second passivation layer 114. The conductive pillar 120 is formed on a surface 102s of the substrate 102. The conductive pillar 120 includes a first sidewall 124a and a second sidewall 124b opposite to the first sidewall 124a, and a height H2 of the second sidewall 124b is smaller than a height H1 of the first sidewall 124a. In some embodiments, a ratio of the height H2 of the second sidewall 124b to the height H1 of the first sidewall 124a is smaller than 0.9, for example. The height H1 (e.g., the largest height) of the conductive pillar 120 may be larger than 30 μm. In some embodiments, the height H1 may be larger than 40 μm. In some alternative embodiments, the height H1 may be in a range of 40 μm and 50 μm or 40 μm and 70 μm. However, the disclosure is not limited thereto. In other words, the height H1 may be greater or smaller. In some embodiments, the conductive pillar 120 is disposed on the UBM layer 116, and the first and second sidewalls 124a, 124b of the conductive pillar 120 are substantially flush with the opposite sidewalls of the UBM layer 116. The inclined top surface 122 is formed between the first sidewall 124a and the second sidewall 124b and is inclined with respect to the surface 102s of the substrate 102. For example, the inclined top surface 122 is continuously formed between the first sidewall 124a and the second sidewall 124b. The inclined top surface 122 is physically connected to the first sidewall 124a and the second sidewall 124b respectively. In some embodiments, an included angle θ is formed between the inclined top surface 122 and a horizontal line HL, and the included angle θ is in a range of 1 degree to 15 degrees. When the included angle θ is less than 1 degree, the inclined top surface may not be formed, and when the included angle θ is larger than 15 degrees, the stress would be higher due to fully intermetallic compound in short side of conductive pillar, for example. In some embodiments, the horizontal line HL is substantially parallel to the surface 102s of the substrate 102 (or a surface 114s of the second passivation layer 114) and perpendicular to a height direction of the conductive pillar 120. For example, the horizontal line HL is perpendicular to the first sidewall 124a and/or the second sidewall 124b.

In some embodiments, as shown in FIG. 1D, the first sidewalls 124a (e.g., a sidewall having the largest height) are disposed at the same side of the conductive pillars 120. Similarly, the second sidewalls 124b (e.g., the sidewall having the smallest height) are disposed at the other same side of the conductive pillars 120. For example, the first sidewalls 124a are at the right side of the conductive pillars 120, and the second sidewalls 124b are at the left side of the conductive pillars 120.

Figure 2A:
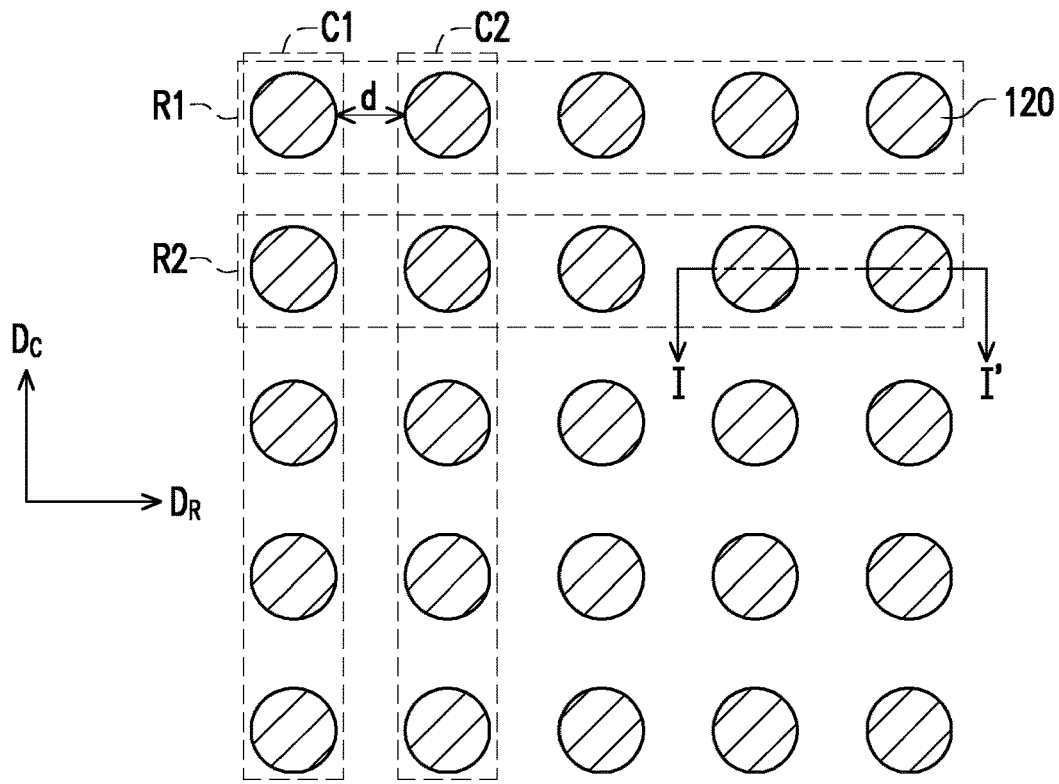
FIGS. 2A and 2B respectively illustrate a schematic top view of FIG. 1D.
Figure 2B:
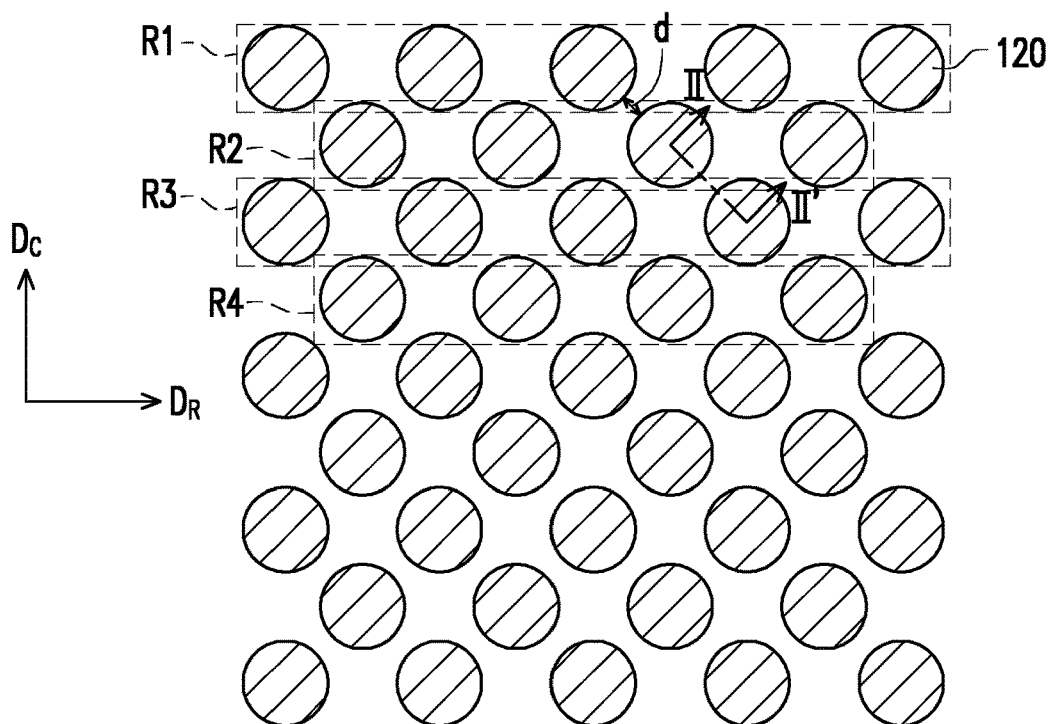

FIGS. 2A and 2B respectively illustrate a schematic top view of FIG. 1D. For example, FIG. 1D illustrates a cross-sectional view of the conductive pillars of FIG. 2A taken along line I-I' and a cross-sectional view of the conductive pillars of FIG. 2B taken along line II-II' respectively. In some embodiments, as shown in FIG. 2A, the conductive pillars 120 may be arranged in an array, that is, the conductive pillars 120 are arranged into a plurality of rows R1, R2 along a row direction DR and a plurality of columns C1, C2 along a column direction Dc. In some embodiments, the conductive pillars 120 in different rows are aligned with one another along the columnar direction $D_c$, and the conductive pillars 120 in different columns are aligned with one another along the row direction DR. For example, the conductive pillars 120 in a first row R1 are respectively aligned with the conductive pillars 120 in a second row R2 adjacent to the first row R1 along the row direction DR. In some embodiments, as shown in FIGS. 1D and 2A, a distance d (e.g., a horizontal distance) between the conductive pillars 120 is in a range of 20 μm to 50 μm, for example. However, the disclosure is not limited thereto. In some alternative embodiments, as shown in FIG. 2B, the conductive pillars 120 may be arranged more densely. In such embodiments, along the columnar direction $D_c$, the conductive pillars 120 in odd rows are aligned with one another, the conductive pillars 120 in even rows are aligned with one another, and the conductive pillars 120 in the odd rows and the conductive pillars 120 in the even rows are alternately disposed. For example, along the row direction DR, the conductive pillars 120 in a first row R1 are respectively aligned with the conductive pillars 120 in a third row R3, the conductive pillars 120 in a second row R2 are respectively aligned with the conductive pillars 120 in a fourth row R4, and the conductive pillars 120 in the first row R1 and the conductive pillars 120 in the second row R2 are alternately disposed.

Figure 1E:
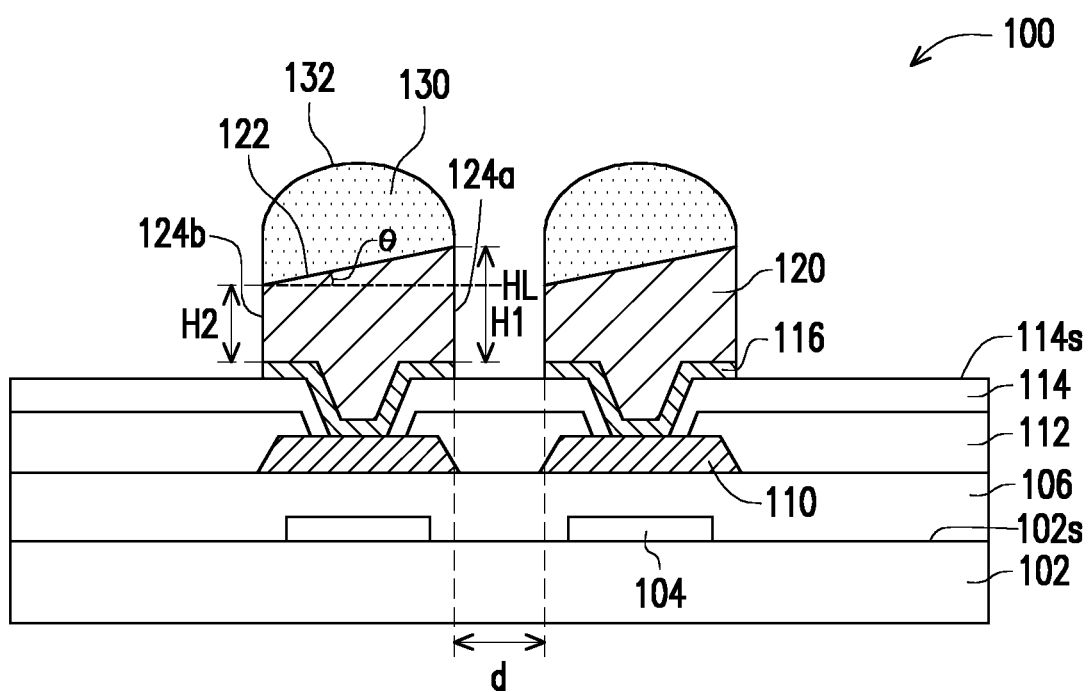

Referring to FIG. 1E, a plurality of solder regions 130 are disposed on the inclined top surfaces 122 of the conductive pillars 120. In some embodiments, after forming the solder regions 130, an electrical device 100 is formed. In some embodiments, the solder region 130 is made of tin (Sn), SnAg, SnPb, SnAgCu, SnAgZn, SnZn, SnBiIn, SnIn, SnAu, SnPb, SnCu, SnZnIn, SnAgSb, the like, or a combination thereof. In some embodiments, the solder region 130 is formed by an electroplating process, a physical vapor deposition (PVD) process, a chemical vapor deposition (CVD) process, or the like.

The solder regions 130 are used to bond the electrical device 100 to external features. The solder regions 130 and the conductive pillars 120 are referred to as bump structures formed over the conductive pads 110. In some embodiments, the solder region 130 has a rounded (or spherical) top surface 132, for example. In some embodiments, the solder region 130 has a mean height, measured from a top point of the top surface 132 to the top surface 122 of the conductive pillar 120. The mean height is in a range of 20 μm and 30 μm, for example. As shown in FIG. 1E, the solder regions 130 are formed on the conductive pillars 120 without wetting on the first and second sidewalls 124a, 124b of the conductive pillars 120. For example, edges of the solder region 130 are substantially flush with the first sidewall 124a and the second sidewall 124b of the conductive pillars 120. However, the disclosure is not limited thereto.

In some alternative embodiments, a cap layer (not shown) is formed between the conductive pillar 120 and the solder region 130. The cap layer could act as a barrier layer to prevent metal such as copper in the conductive pillar 120 from diffusing into the solder regions 130. The prevention of metal diffusion increases the reliability and bonding strength of the package. The cap layer may include nickel, tin, tin-lead (SnPb), gold (Au), silver, palladium (Pd), indium (In), nickel-palladium-gold (NiPdAu), nickel-gold (NiAu), other similar materials, or alloy.

In some embodiments, the electrical device 100 is a device die (e.g., an integrated circuit die) that includes active devices such as transistors therein. However, the disclosure is not limited thereto. In some alternative embodiments, the electrical device 100 may be an interposer, a packaging substrate, a printed circuit board, a high-density interconnect, or the like that does not have active devices therein.

Figure 3A:
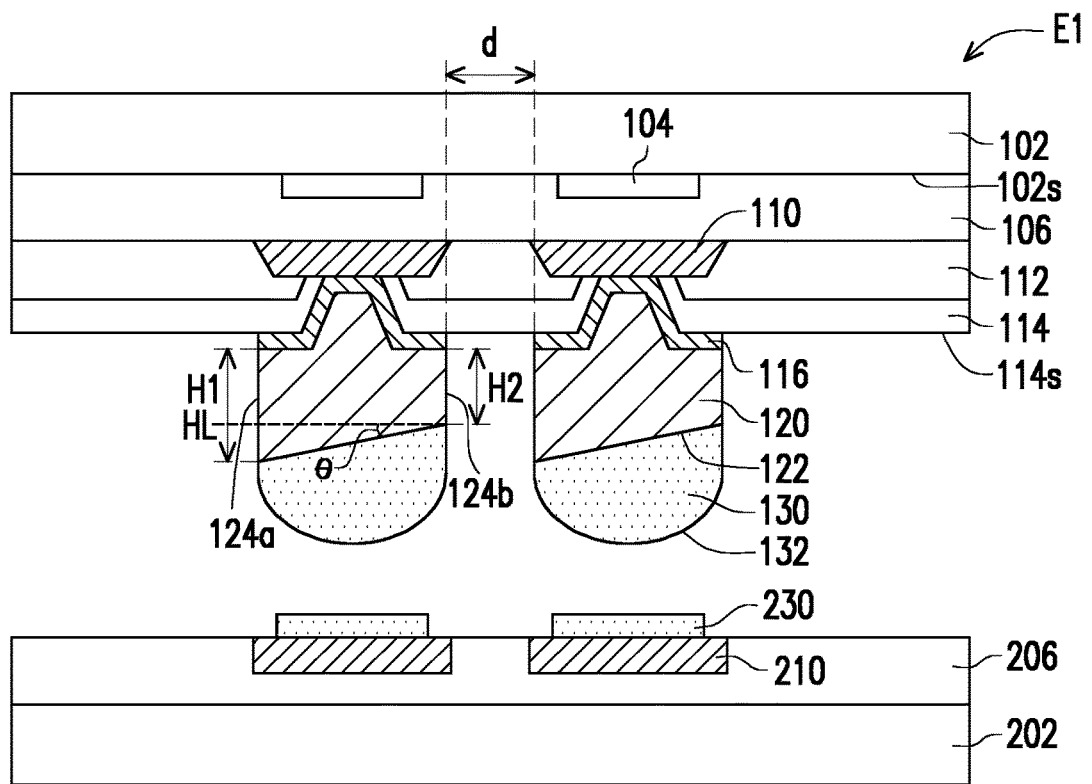
FIGS. 3A and 3B illustrate cross-sectional views of a method of forming a semiconductor package in accordance with some embodiments.
Figure 3B:
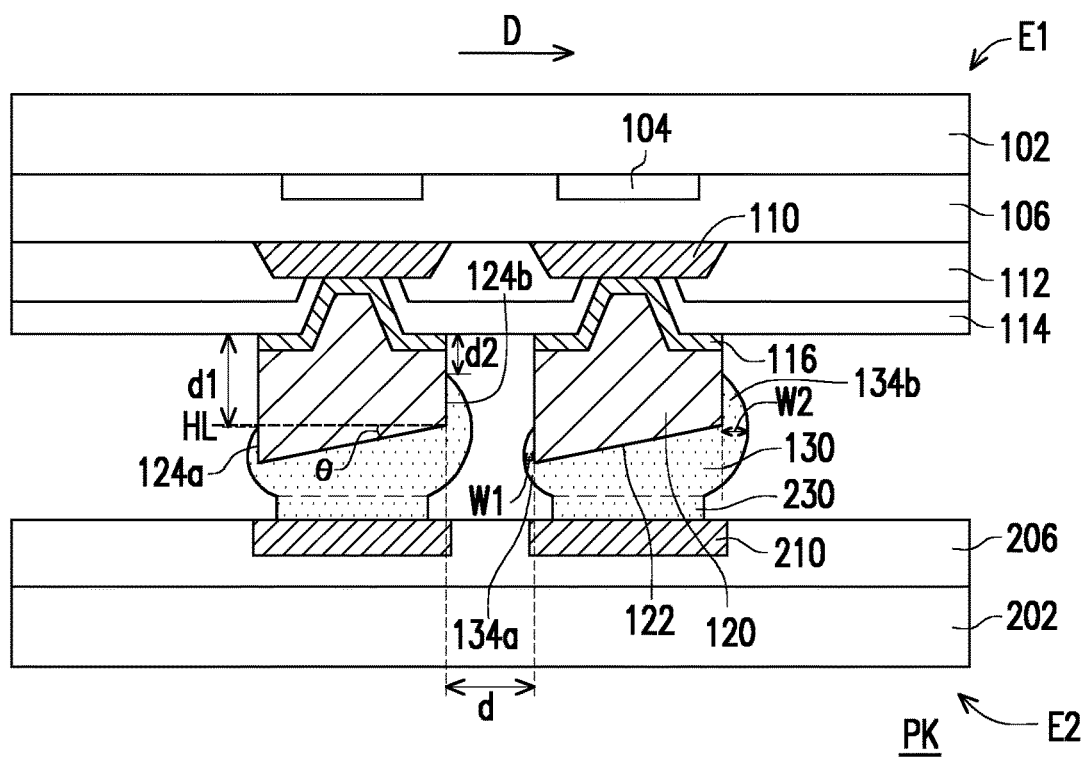

FIGS. 3A and 3B illustrate cross-sectional views of a method of forming a semiconductor package in accordance with some embodiments.

Referring to FIG. 3A, a first electrical device E1 and a second electrical device E2 are provided. The first electrical device E1 is substantially the same as or similar to the electrical device 100 of FIG. 1E. In some embodiments, the second electrical device E2 may be a package substrate, a device die, an interposer, or the like. In some embodiments, the second electrical device E2 may include a substrate 202, an interconnect structure 206 and a plurality of conductive pads 210. In some embodiments, the semiconductor substrate 202 includes an elementary semiconductor such as silicon or germanium and/or a compound semiconductor such as silicon germanium, silicon carbide, gallium arsenic, indium arsenide, gallium nitride, or indium phosphide. In some embodiments, the semiconductor substrate 202 includes a silicon-containing material. For example, the semiconductor substrate 202 is a silicon-on-insulator (SOI) substrate, or a silicon substrate. In various embodiments, the semiconductor substrate 202 may take the form of a planar substrate, a substrate with multiple fins, nanowires, or other forms known to people having ordinary skill in the art. Depending on the requirements of design, the semiconductor substrate 202 may be a P-type substrate or an N-type substrate and may have doped regions therein. The doped regions may be configured for an N-type device or a P-type device. In some embodiments, the semiconductor substrate 202 may have through substrate vias therein upon the process requirements.

In some embodiments, the interconnect structure 206 is disposed over a side (e.g., front side) of the semiconductor substrate 202. In some embodiments, the interconnect structure 206 includes at least one insulating layer and a plurality of metal features. The metal features are disposed in the insulating layer and electrically connected with each other. In some embodiments, the insulating layer includes an inter-layer dielectric (ILD) layer on the semiconductor substrate 202, and at least one inter-metal dielectric (IMD) layer over the inter-layer dielectric layer. In some embodiments, the insulating layer includes silicon oxide, silicon oxynitride, silicon nitride, benzocyclobutene (BCB) polymer, polyimide (PI), polybenzoxazole (PBO), or a combination thereof, and is formed by a suitable process such as spin coating, CVD, or the like. The insulating layer may be a single layer or a multiple-layer structure. In some embodiments, the metal features include metal vias and metal lines. The metal vias are formed between and in contact with two metal lines. The metal features may include tungsten (W), copper (Cu), a copper alloy, aluminum (Al), an aluminum alloy, or a combination thereof. In some embodiments, a barrier layer may be disposed between each metal feature and the insulating layer to prevent the material of the metal feature from migrating to the underlying device 204. The barrier layer may include tantalum (Ta), tantalum nitride (TaN), titanium (Ti), titanium nitride (TiN), cobalt tungsten (CoW), or a combination thereof. In some embodiments, the interconnect structure 206 is formed by a dual damascene process. In alternative embodiments, the interconnect structure 206 is formed by multiple single damascene processes. In yet alternative embodiments, the interconnect structure 206 is formed by an electroplating process.

The conductive pads 210 are formed over the semiconductor substrate 202. In some embodiments, the conductive pads 210 are formed over the insulating layer of the interconnect structure 206. Further, the conductive pads 210 may be electrically connected to top metal features exposed by the insulating layer of the interconnect structure 206. The conductive pads 210 may include tungsten (W), copper (Cu), a copper alloy, aluminum (Al), an aluminum alloy, titanium (Ti), a titanium alloy, tantalum (Ta), a tantalum alloy, the like, or a combination thereof. For example, the conductive pads 210 are aluminum pads. In some embodiments, the conductive pads 210 may be formed by an electroplating process or other suitable process.

In some embodiments, a plurality of solder regions 230 are disposed on the conductive pads 210 respectively. In some embodiments, the solder region 230 is made of tin (Sn), SnAg, SnPb, SnAgCu, SnAgZn, SnZn, SnBiIn, SnIn, SnAu, SnPb, SnCu, SnZnIn, SnAgSb, the like, or a combination thereof. In some embodiments, the solder region 230 is formed by a deposition process, such as an electroplating process, a physical vapor deposition (PVD) process, a chemical vapor deposition (CVD) process, or the like.

Referring to FIG. 3B, the first electrical device E1 and the second electrical device E2 are bonded to form a semiconductor package PK. In some embodiments, the first electrical device E1 and the second electrical device E2 may be bonded through flip-chip bonding. For example, the solder regions 130 of the first electrical device E1 and the solder regions 230 of the second electrical device E2 are aligned respectively, and then a reflow process is performed, so as to bond the solder regions 130 of the first electrical device E1 and the solder regions 230 of the second electrical device E2 together. In some embodiments, a solder joint (not shown) is formed between the solder region 130 of the first electrical device E1 and the solder region 230 of the second electrical device E2. In addition, due to the inter-diffusion, an inter-metallic compound (IMC) (not shown) may be formed at an interface between the solder region 130 and the conductive pillar 120 and/or at an interface between the solder region 230 and the conductive pad 210. In some embodiments, the reflow process is performed at a melting point temperature of the solder regions 130 and/or the solder regions 230. In some embodiments, the reflow process is performed at a temperature in a range from about 100 degrees Celsius to about 300 degrees Celsius. When the temperature is within above-mentioned range, the bonding quality and bonding yield are improved. However, the disclosure is not limited thereto.

As shown in FIG. 3B, during the bonding step, the solder regions 130 may be squeezed aside by the conductive pillars 120 to form solder regions 134a, 134b. In some embodiments, portions of the sidewalls 124a, 124b of the conductive pillars 120 are covered by the solder regions 134a, 134b respectively, which also referred to as sidewall wetting. In some embodiments, the sidewalls 124a, 124b of the conductive pillars 120 have different heights H1, H2, and thus the solder regions 130 are liable to be squeezed toward the sidewalls 124b having the smaller height. That is, most of the solder regions 130 may be squeezed substantially along the same direction D. The direction D is a direction from the sidewall 124a (e.g., the long sidewall) to the sidewall 124b (e.g., the short sidewall). As shown in FIG. 3B, for each conductive pillar 120, most of the solder region 130 is squeezed onto the sidewall 124b of the conductive pillar 120. In other words, an amount of the solder region 134a on the sidewall 124a is less than an amount of the solder region 134b on the sidewall 124b. In some embodiments, a width W1 of the solder region 134a on the sidewall 124a (e.g., a largest horizontal width measured from an outer surface of the solder region 134a to the sidewall 124a) is less than a width W2 of the solder region 134b on the sidewall 124b (e.g., a largest horizontal width measured from an outer surface of the solder region 134b to the sidewall 124b). In some embodiments, the width W1 of the solder regions 134a on different conductive pillars 120 may be substantially the same or different, and the width W2 of the solder regions 134b on different conductive pillars 120 may be substantially the same or different. In some embodiments, a total of the width W1 and the width W2 is smaller than the distance d between the adjacent conductive pillars 120. Therefore, between two adjacent conductive pillars 120, the solder region 134a on the sidewall 124a of one conductive pillar 120 is not easy to bridge with the solder region 134b on the sidewall 124b of the other conductive pillar 120. Accordingly, the solder regions 130 on adjacent conductive pillars 120 are separated from each other.

In some embodiments, a distance d1 between the solder region 134a and a surface of the first electrical device E1 (e.g., the surface 114s of the second passivation layer 114) is larger than a distance d2 between the solder region 134b and a surface of the first electrical device E1 (e.g., the surface 114s of the second passivation layer 114), for example. However, the disclosure is not limited thereto. In some alternative embodiments, the distance d1 may be substantially the same as or smaller than the distance d2. Further, in some embodiments, the solder regions 134a, 134b on the sidewalls 124a, 124b of the conductive pillar 120 are illustrated as portions of the solder region 130. However, the disclosure is not limited thereto. In some alternative embodiments, the solder regions 134a, 134b on the sidewalls 124a, 124b of the conductive pillar 120 may be formed from both of the solder region 130 and the solder region 230.

Figure 4:
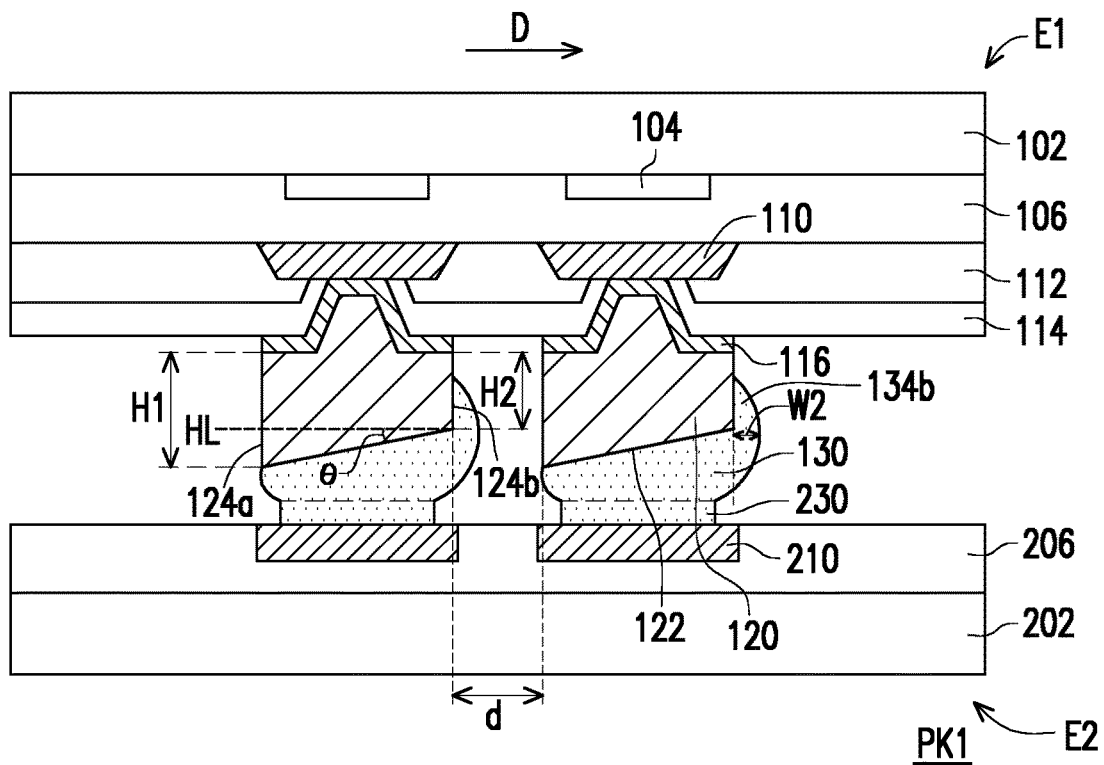
FIG. 4 illustrates a cross-sectional view of a semiconductor package in accordance with some embodiments.

FIG. 4 illustrates a cross-sectional view of a semiconductor package in accordance with some embodiments. The semiconductor package PK1 of FIG. 4 is similar to the semiconductor package PK of FIG. 3B, and the main difference is described below. Referring to FIG. 4, in some embodiments, most of the solder regions 130 may be squeezed onto the sidewalls 124b of the conductive pillars 120. That is, most of the solder regions 130 may be squeezed substantially along the same direction D. In some embodiments, there is substantially no solders on the sidewalls 124a of the conductive pillars 120, in other words, solder wetting does not occur on the sidewalls 124a of the conductive pillars 120. Furthermore, the width W2 of the solder region 134b is smaller than the distance d between the adjacent conductive pillars 120. That is, the solder region 134b on the conductive pillar 120 is not in contact with another conductive pillar 120 adjacent thereto. Accordingly, solder bridge between the solder regions on adjacent conductive pillars may be prevented.

Figure 5:
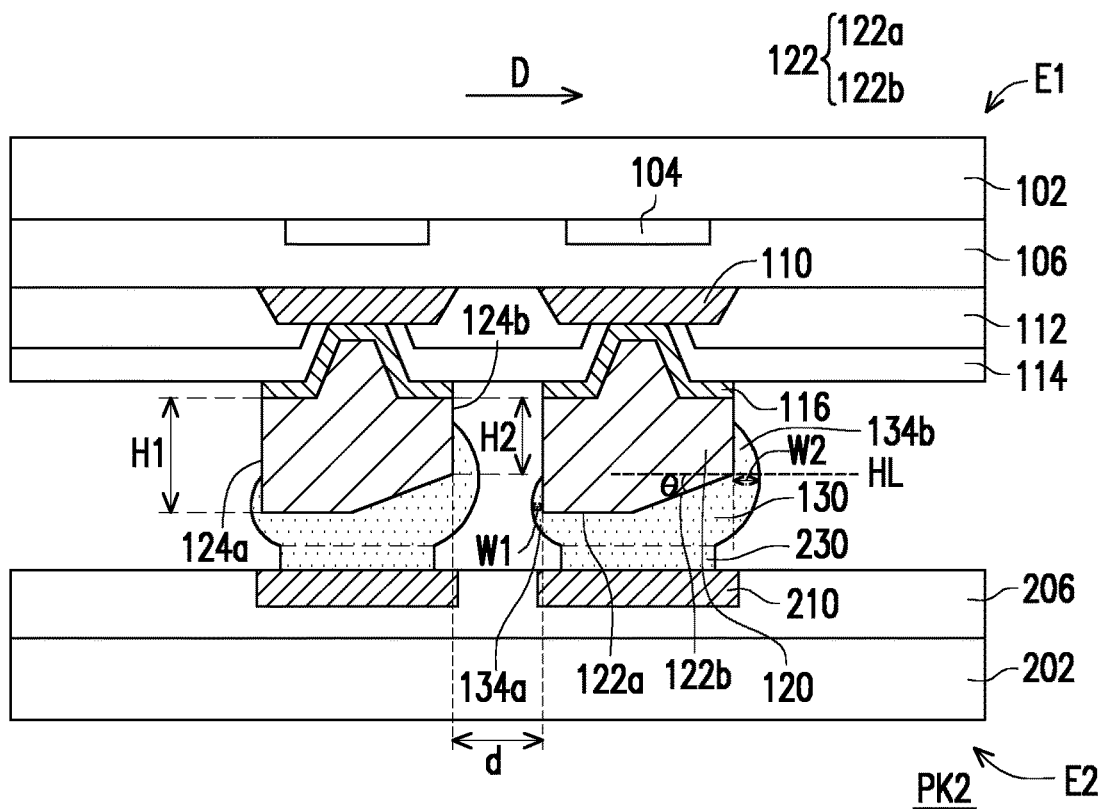
FIG. 5 illustrates a cross-sectional view of a semiconductor package in accordance with some embodiments.

FIG. 5 illustrates a cross-sectional view of a semiconductor package in accordance with some embodiments. The semiconductor package PK2 of FIG. 5 is similar to the semiconductor package PK of FIG. 3B, and the main difference is described below. Referring to FIG. 5, in some embodiments, the top surface 122 of the conductive pillar 120 has an incline portion 122b and a flat portion 122a. In some embodiments, the flat portion 122a is physically connected to the first sidewall 124a, and the flat portion 122a is substantially parallel to a horizontal line HL. The horizontal line HL is substantially parallel to a surface 102s of the substrate 102 (or a surface 114s of the second passivation layer 114) and perpendicular to a height direction of the conductive pillar 120. For example, the horizontal line HL is perpendicular to the first sidewall 124a and/or the second sidewall 124b. The flat portion 122a is physically connected to the second sidewall 124b, and an included angle θ is formed between the inclined top surface 122 and the horizontal line HL. The included angle θ may be in a range of 1 degree to 15 degrees, for example. In some embodiments, a ratio of the incline portion 122b to the top surface 122 (e.g., a width of the incline portion 122b to a width of the top surface 122) is in a range of 50-100%. In some embodiments, a width of the flat portion 122a may be in a range of 0 μm to 30 μm. In some embodiments, the top surfaces 122 of the conductive pillars 120 have the incline portions 122b, and thus the solder regions 130 are liable to be squeezed toward the sidewalls 124b having the smaller height. That is, most of the solder regions 130 may be squeezed substantially along the same direction D. Therefore, between two adjacent conductive pillars 120, the solder region 134a on the sidewall 124a of one conductive pillar 120 is not easy to bridge with the solder region 134b on the sidewall 124b of the other conductive pillar 120. Accordingly, solder bridge between the solder regions on adjacent conductive pillars may be prevented.

In some embodiments, since the conductive pillars of the electrical device have the inclined top surfaces, solders on the conductive pillars are liable to be squeezed onto the sidewalls having smaller height. Accordingly, solder bridge between the solder regions on adjacent conductive pillars are prevented. Thus, in some embodiments, the semiconductor package formed by bonding the electrical device and another electric device through the solder regions may have a better yield and an improved performance.

According to some embodiments, an electrical device includes a substrate, a conductive pad, a conductive pillar and a solder region. The substrate has a surface. The conductive pad is disposed on the surface of the substrate. The conductive pillar is disposed on and electrically connected to the conductive pad, wherein a top surface of the conductive pillar is inclined with respect to the surface of the substrate. The solder region is disposed on the top surface of the conductive pillar.

According to some embodiments, a semiconductor package includes a first electrical device, a second electrical device and a plurality of solder regions. The first electrical device includes a plurality of conductive pillars, and the conductive pillars respectively include an inclined top surface. The second electrical device includes a plurality of conductive pads. The solder regions are disposed between the conductive pillars and the conductive pads to bond the first electrical device and the second electrical device, wherein the adjacent solder regions are separated from each other.

According to some embodiments, a method of forming a semiconductor package is provided. A first electrical device is provided, wherein the first electrical device includes a plurality of conductive pillars having inclined top surfaces and a plurality of solder regions on the inclined top surfaces. A second electrical device is provided, wherein the second electrical device includes a plurality of conductive pads. The first electrical device is bonded onto the second electrical device through the solder regions, wherein the solder regions are separated from each other after bonding.

According to some embodiments, a semiconductor package includes a first device, a second device and a solder region. The first device includes a first conductive pillar, wherein the first conductive pillar has a first sidewall, a second sidewall opposite to the first sidewall, a first surface and a second surface physically connected to the first surface, the first surface and the second surface are disposed between the first sidewall and the second sidewall, and an included angle is formed between the first surface and the second surface. The solder region is disposed between the first conductive pillar and the second device to bond the first device and the second device.

According to some embodiments, a semiconductor package includes a first device, a second device and a plurality of solder regions. The first device includes a plurality of conductive pillars, wherein surfaces of the conductive pillars respectively have planar portions and inclined portions physically connected to the planar portions, the planar portions are respectively disposed at first sides of the conductive pillars, and the inclined portions are respectively disposed at second sides opposite to the first sides of the conductive pillars. The second device includes a plurality of conductive pads. The solder regions are respectively disposed between the conductive pillars and the conductive pads to bond the first device and the second device.

According to some embodiments, a semiconductor package includes a first device, a second device and a solder region. The first device includes a conductive pillar. The solder region is disposed between the conductive pillar and the second device, wherein the solder region includes a first portion and a second portion, the second portion is disposed between the first portion and the conductive pillar and in direct contact with the second device, and the second portion is hanging over a sidewall of the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first conductive pillar, wherein the first conductive pillar has a first sidewall, a second sidewall opposite to the first sidewall, a first surface and a second surface physically connected to the first surface, the first surface and the second surface are disposed between the first sidewall and the second sidewall, and an included angle is formed between the first surface and the second surface, wherein a height of the first sidewall is greater than a height of the second sidewall;
   a conductive pad; and
   a solder region disposed between and in direct contact with the first conductive pillar and the conductive pad, wherein the solder region has a first convex sidewall on the second sidewall of the first conductive pillar.

2. The semiconductor package as claimed in claim 1, wherein the included angle is in a range of 1 degree to 15 degrees.

3. The semiconductor package as claimed in claim 1, wherein the first surface of the first conductive pillar is physically connected to the first sidewall, and the second surface of the first conductive pillar is physically connected to the second sidewall.

4. The semiconductor package as claimed in claim 1, wherein the first surface of the first conductive pillar is a horizontal surface, and the second surface of the first conductive pillar is an inclined surface.

5. The semiconductor package as claimed in claim 1, wherein the solder region has a second convex sidewall on the first sidewall of the first conductive pillar.

6. The semiconductor package as claimed in claim 1, wherein a portion of the solder region has a substantially vertical sidewall between the first convex sidewall and the conductive pad.

7. A semiconductor package, comprising:
   a first device comprising a plurality of conductive pillars, wherein surfaces of the conductive pillars respectively have planar portions and inclined portions physically connected to the planar portions, the planar portions are respectively disposed at first sidewalls of the conductive pillars, and the inclined portions are respectively disposed at second sidewalls of the conductive pillars, wherein a height of the first sidewalls is greater than a height of the second sidewalls;
   a second device comprising a plurality of conductive pads; and
   a plurality of solder regions respectively disposed between the conductive pillars and the conductive pads to bond the first device and the second device, wherein an amount of the solder regions on the first sidewalls of the conductive pillars is smaller than an amount of the solder regions on the second sidewalls of the conductive pillars.

8. The semiconductor package as claimed in claim 7, wherein included angles respectively formed between the planar portions and the inclined portions are substantially the same.

9. The semiconductor package as claimed in claim 7, wherein the planar portions are substantially coplanar.

10. The semiconductor package as claimed in claim 7, wherein the solder regions flow along a flow path from the first sidewalls to the second sidewalls respectively, and the solder regions are separated from each other after bonding.

11. The semiconductor package as claimed in claim 10, wherein a first largest width of the solder regions on the first sidewalls of the conductive pillars is smaller than a second largest width of the solder regions on the second sidewalls of the conductive pillars.

12. A semiconductor package, comprising:
a first device comprising a conductive pillar, wherein the conductive pillar has a first sidewall and a second sidewall, and a height of the first sidewall is greater than a height of the second sidewall;
a second device; and
a solder region between the conductive pillar and the second device, wherein the solder region includes a first portion and a second portion, the second portion is disposed between the first portion and the conductive pillar and the first portion is in direct contact with the second device, and the second portion is hanging over a sidewall of the first portion and is disposed on the second sidewall of conductive pillar.

13. The semiconductor package as claimed in claim 12, wherein the second portion is hanging over opposite sidewalls of the first portion.

14. The semiconductor package as claimed in claim 12, wherein the second portion is further disposed on the first sidewall of the conductive pillar.

15. The semiconductor package as claimed in claim 14, wherein an amount of the second portion on the second sidewall of the conductive pillar is larger than an amount of the second portion on the first sidewall of the conductive pillar.

16. The semiconductor package as claimed in claim 15, wherein in a direction substantially perpendicular to a stacking direction of the first device and the second device, a first largest width of the second portion of the solder region on the first sidewall of the conductive pillar is smaller than a second largest width of the second portion of the solder region on the second sidewall of the conductive pillar.

17. The semiconductor package as claimed in claim 15, wherein in a stacking direction of the first device and the second device, a height of the second portion of the solder region on the first sidewall of the conductive pillar is smaller than a height of the second portion of the solder region on the second sidewall of the conductive pillar.

18. The semiconductor package as claimed in claim 12, wherein the second portion of the solder region has convex sidewalls.

19. The semiconductor package as claimed in claim 12, wherein the first portion of the solder region has a substantially vertical sidewall.

20. The semiconductor package as claimed in claim 12, wherein the first portion is integrally formed with the second portion.

* * * * *